United States Patent
Pikovsky et al.

(10) Patent No.: US 6,942,019 B2
(45) Date of Patent: Sep. 13, 2005

(54) APPARATUS AND METHOD FOR CIRCUIT BOARD LIQUID COOLING

(75) Inventors: Anatoly Pikovsky, Sharon, MA (US); Andrew Roemer, Pomfret Center, CT (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 10/105,204

(22) Filed: Mar. 25, 2002

(65) Prior Publication Data

US 2003/0178182 A1 Sep. 25, 2003

(51) Int. Cl.[7] .............................................. H05K 7/20
(52) U.S. Cl. ...................... 165/80.4; 165/170; 361/699
(58) Field of Search ............................. 165/80.4, 168, 165/170; 361/699

(56) References Cited

U.S. PATENT DOCUMENTS

| | | | |
|---|---|---|---|
| 2,064,141 A | * 12/1936 | Askin ..................... 29/890.035 |
| 2,143,171 A | * 1/1939 | Anderson .................... 62/523 |
| 3,053,514 A | * 9/1962 | Grenell ....................... 165/170 |
| 3,226,602 A | * 12/1965 | Elfving ....................... 361/700 |
| 3,651,865 A | * 3/1972 | Feldmanis ................. 165/80.4 |
| 3,746,942 A | 7/1973 | Brown et al. |
| 4,392,153 A | 7/1983 | Glascock, II et al. |
| 4,573,067 A | 2/1986 | Tuckerman et al. |
| 4,884,168 A | * 11/1989 | August et al. .............. 361/702 |
| 4,971,144 A | * 11/1990 | Gibson et al. .............. 165/170 |
| 5,049,973 A | 9/1991 | Satriano |
| 5,239,200 A | 8/1993 | Messina et al. |
| 5,345,107 A | 9/1994 | Daikoku et al. |
| 5,373,417 A | 12/1994 | Barrett |
| 5,509,468 A | * 4/1996 | Lopez ........................ 165/144 |
| 5,701,751 A | 12/1997 | Flores |
| 5,719,444 A | 2/1998 | Tilton et al. |
| 5,755,278 A | * 5/1998 | Shinohara et al. ...... 165/104.33 |
| 5,880,931 A | 3/1999 | Tilton et al. |
| 5,983,997 A | * 11/1999 | Hou ............................ 165/144 |
| 6,313,992 B1 | 11/2001 | Hildebrandt |

* cited by examiner

Primary Examiner—Allen J. Flanigan
(74) Attorney, Agent, or Firm—McDermott Will & Emery LLP (57) ABSTRACT

A circuit board cooling system employs a closed liquid delivery system to transfer heat from integrated circuits to a cooling liquid. The system includes one or more cooling panels that may be attached to a circuit board. Each cooing panel includes at least one channel for the circulation of cooling liquid stamped into a thermally conductive material. Each panel may include multiple levels in order to conform to the profile of integrated circuits to be cooled.

23 Claims, 6 Drawing Sheets

APPARATUS AND METHOD FOR CIRCUIT BOARD LIQUID COOLING

FIELD OF THE INVENTION

The present invention relates to the cooling of electronics, and more particularly to high capacity cooling systems for electronics located on circuit boards.

BACKGROUND OF THE INVENTION

As electronics systems continue to decrease in size and increase in performance (with a concomitant increase in power consumption), power density becomes a major design issue. That is, electronic circuits operate efficiently and effectively only over a prescribed temperature range. Operating outside this range can degrade and even destroy the circuit. Although there are many performance and price motivations for packing as much circuitry into as small a volume as possible, packing too much circuitry into a given volume creates a power density that could destroy the electronic circuitry. Many electronic circuit cooling systems, both active and passive have been employed over the years to varying degrees of effectiveness. U.S. Pat. Nos. 5,719,444; 6,313,992 B1; 5,880,931; 5,701,751; 4,392,153; 4,573,067; 5,239,200; 5,345,107; 5,049,973; 5,373,417; and 3,746,942 disclose various cooling systems and methods for electronics systems and are all hereby incorporated by reference.

Notwithstanding the performance afforded by conventional circuit board cooling systems, a circuit board cooling system that provides high capacity cooling at a relatively low cost, and which occupies very little space would be highly desirable.

SUMMARY OF THE INVENTION

A liquid cooling panel in accordance with the principles of the present invention employs a closed fluid delivery system to transfer heat from integrated circuits to a cooling liquid. A liquid cooling panel includes one or more liquid circulation channels. Each channel is stamped into a thermally conductive plate and a cover is attached to the plate to form a channel. The channel cover may take the form of a second thermally conductive plate, for example. In an illustrative embodiment, the thermally conductive material into which the channel is stamped is a thin copper plate.

In an illustrative two-plate embodiment, the process of creating the liquid cooling panel employs two copper plates having substantially the same outline. A pattern is stamped into at least one of the plates to form a shallow, bas-relief channel for liquid coolant to pass through. The two plates are then soldered together. In addition to stamping at least one of the plates to form the liquid channel, both plates may be stamped to conform to the counters of a circuit board, which they are designed to cool. That is, integrated circuits of different heights will create a varied-height circuit board profile when loaded in a circuit board. Since the channels of the liquid cooling panel are meant to make intimate thermal contact with the integrated circuits located on the circuit board targeted for cooling, the liquid-cooling plates may be stamped to form a plurality of levels, thus permitting the liquid cooling channels to make thermally conductive contact with the integrated circuits to be cooled. Cooling panels may be attached to both sides of a circuit board. A three-plated sandwich embodiment, with plates having channels stamped in them fixed to either side of a channel cover permits coolant liquid to be delivered to circuit boards situated on either side of the liquid cooling panel.

The liquid cooling panel channel may take on any of a variety of layouts, with particular attention paid to delivering cooling liquid to predetermined "hot spots" on the circuit board to be cooled. A channel having a serpentine leg, combined with a straight leg, has been found to provide effective cooling using a relatively compact layout. In an illustrative embodiment, the cross-section of the liquid cooling panel channel may take the form of an oblate "D". In this embodiment, a channel cover (which may take the form of an unstamped plate) forms the flattest side of the "D" cross-section and the stamped plate provides a relatively shallow arced portion of the "D". Various thermal-conduction-enhancing techniques may be employed to improve the flow of thermal energy between an integrated circuit located on the circuit board and the liquid cooling panel. Such techniques may include the use of thermal grease and/or heat spreaders, for example.

A liquid cooling panel in accordance with the principles of the present invention may be attached to a circuit board through conventional attachment means, such as screws, bolts, studs, or rivets, for example. In those areas where, due to the density of circuitry, for example, it is impractical to use attachment means, one or more spring clips may be employed to apply pressure to the cooling panel and to thereby ensure good thermally conductive contact between the cooling panel and the circuitry that is to be cooled. Cooling liquid, such as water, is supplied to the channels through liquid supply fixtures that may be inserted into flexible tubing.

In certain embodiments, the liquid cooling channels are very shallow and the thermally conductive plate used to form the channels are quite thin. In such an embodiment, the panel may be very thin and may accommodate an application in which two cooling panels may be placed back-to-back between electronic circuit boards that are inserted in a relatively cramped environment, such as a card-cage.

BRIEF DESCRIPTION OF THE DRAWINGS

The foregoing and other objects of this invention, the various features thereof, as well as the invention itself, may be more fully understood from the following description, when read together with the accompanying drawings as described below.

DETAILED DESCRIPTION

Figure 1:
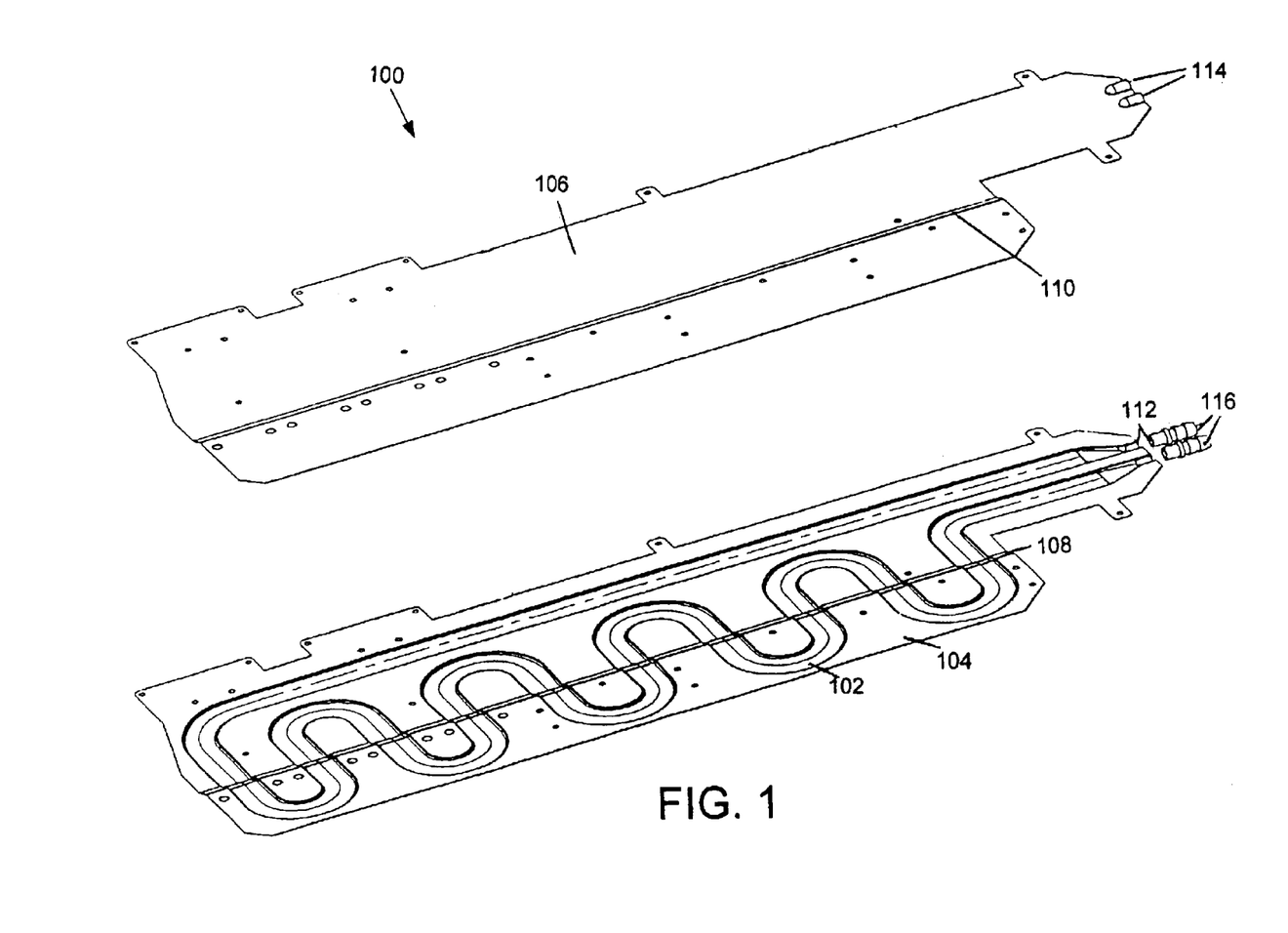
FIG. 1 is an exploded view of a liquid cooling panel in accordance with the principles of the present invention.

The exploded view of FIG. 1 illustrates a liquid cooling panel 100 in accordance with the principles of the present invention. The cooling panel 100 employs a closed fluid delivery system to transfer heat from integrated circuits to a cooling liquid. The cooling panel 100 employs at least one thermally conductive plate having a liquid circulation channel stamped in it and a channel cover. In the illustrative embodiment of FIG. 1, a liquid circulation channel 102 is stamped in a liquid cooling panel comprising first 104 and second 106 plates made of thermally conductive material. In this embodiment, the second plate 106 has substantially the same outline as the thermally conductive plate 104 having a channel stamped in it. The second plate 106 operates as a channel cover for the channel 102 stamped into the plate 104. In an illustrative embodiment, the thermally conductive material of both plates 104 and 106 is 0.012" thick copper. In this illustrative embodiment, a step 108 is formed in the plate 104 to form a multi-level plate and to thereby match the contour of the plate 104 to the profile of the electronics to be cooled. The step 108 may be formed during the same stamping process used to form the channel 102. The second plate 106 also has a step 110 formed in it to match the step 108 of the first plate 104 and to thereby form a closed channel throughout the length of the stamped channel 102. Because integrated circuits of different heights will create a varied-height circuit board profile when loaded in a circuit board, a plurality of matching steps, such as steps 108 and 110 may be formed in the plates 106 and 104, thus permitting liquid cooling channel(s) 102 to make thermally conductive contact with the integrated circuits to be cooled.

The channel 102 is tapered at inlet and outlet ends to form receptacles 112. The second plate 106 has receptacles 114 stamped at a location corresponding to the receptacles 112 of the first plate 104. When the first and second plates are attached to one another, the receptacles 112 and 114 form tubes that provide access to the channel 102. The receptacles 112 and 114 are large enough to accommodate fixtures 116 that are inserted into the receptacles and affixed to the first and second plates in such as manner as to form fixtures for liquid coolant to flow between the channel 102 and a supply, such as a pump and reservoir (not shown). Each of the fixtures 116 may include ridges 118 that aid in retaining flexible tubing into which the fixtures are inserted. The flexible tubing supplies cooling liquid to and drains the liquid from the channel 102 through the fixtures 116. The liquid cooling panel channel 102 may take on any of a variety of layouts, with particular attention paid to delivering cooling liquid to "hot spots" on the circuit board to be cooled. In this illustrative embodiment, the channel 102 features a serpentine leg 103 and a straight leg 105. Water, which may be chilled, may be employed as the liquid coolant.

The process of creating the liquid cooling panel embodiment of FIG. 1 employs two copper plates (104 and 106) having substantially the same outline. A channel pattern 102 is stamped into the plate 104 to form a shallow, bas-relief channel for liquid coolant to pass through. The steps 108 and 110 and receptacles 112 and 114 are also stamped into the respective plates 104 and 106. The fixtures 116 may be placed in the wells of one or the other of the sets of receptacles 112 and 114, then soldered in place as the two plates 104 and 106 are soldered together to form a continuous closed channel with inlet and outlet fixtures 116.

Figure 2:
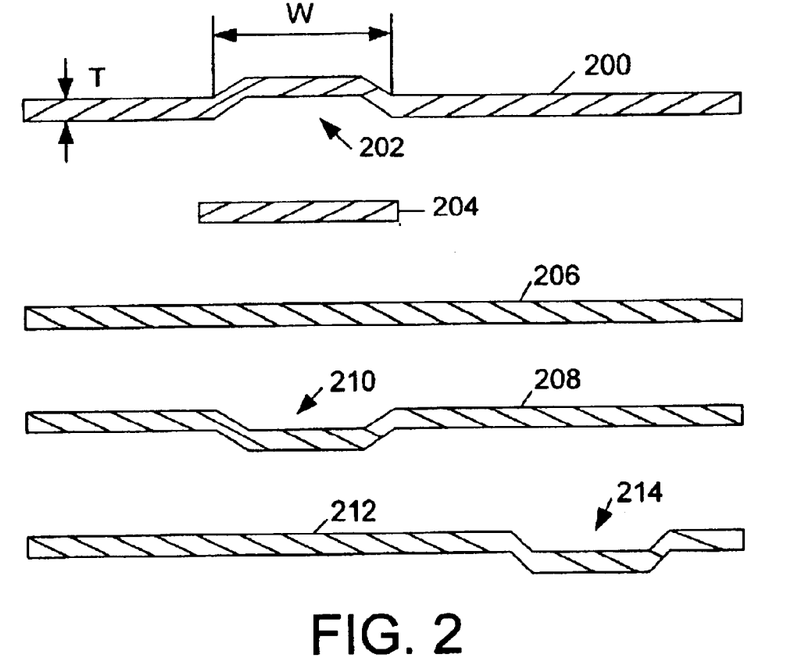
FIG. 2 is a sectional view of various channel-configurations such as might be employed in a cooling panel in accordance with the principles of the present invention.

The exploded sectional view of FIG. 2 illustrates the channel structure of a liquid cooling panel in accordance with the principles of the present invention. In an illustrative embodiment, the plate 200 includes a stamped channel 202. The plate thickness, T, is 0.012", the height of the channel, H, is 0.03", and the width of the channel, W, is 0.50". The overall thickness of the cooling panel is 0.054" In an illustrative embodiment, the cross-section of the liquid cooling panel channel may take the form of an oblate "D". In this embodiment, an unstamped plate forms the flattest side of the "D" cross-section and the stamped plate provides a relatively shallow curved portion of the "D". Various thermal-conduction-enhancing techniques may be employed to improve the flow of thermal energy from an integrated circuit located on the circuit board and the liquid cooling panel. Such techniques may include the use of thermal grease and/or heat spreaders, for example. A channel cover 204 may closely conform to the outline of the stamped channel, slightly overlapping the stamped channel 202 on either side, so that the channel cover 204 may be attached to the plate in a liquid-tight manner, thereby enclosing the channel 202. The channel cover 204 needn't be formed of a thermally conductive material, and various attachment techniques, the use of gaskets, for example, may be employed to ensure a liquid-tight seal with the stamped plate 200.

Alternatively, a second thermally conductive plate 206, having substantially the same outline as the stamped plate 200 may be employed as the channel cover. In this illustrative embodiment, for benefits of cost and convenience, the plate 206 is made of the same stock, that is, the same material and thickness, as the stamped plate 200. The channel cover may form a seal that is flat in cross-section for the channel 202. That is, even if following the contours of the channel 202 in a multilevel plate embodiment, the "bottom" of the channel formed by the plate 206 or cover 204 lies in a plane substantially parallel to the local plane of the plate 200. Alternatively, as illustrated by the plate 208, the channel cover may incorporate a stamped channel 210 of it's own. The stamped channel 210 may mirror the stamped channel 202, thereby providing a deeper channel for liquid flow than a single channel 202 of the same cross-section. A cover plate 212 may include a stamped channel 214 whose outline does not coincide with, or overlap that of the channel 202. This embodiment provides independent cooling patterns for the two sides of the cooling panel.

Figure 3:
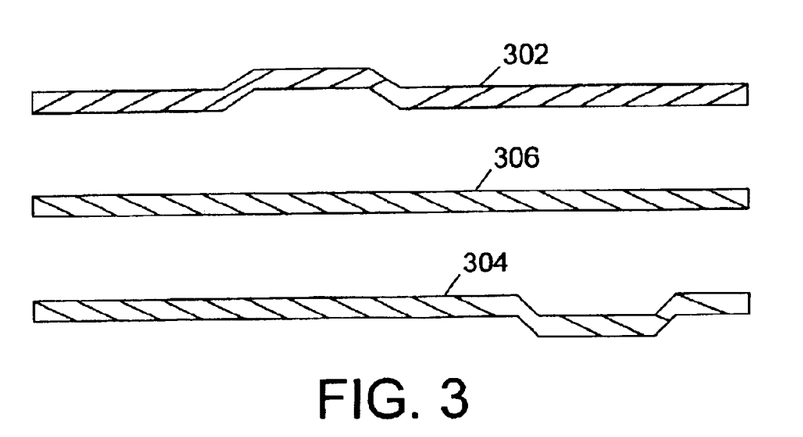
FIG. 3 is a sectional view of three-plate channel configuration such as might be employed in a cooling panel in accordance with the principles of the present invention.

The exploded sectional view of FIG. 3 illustrates an embodiment of a circuit board liquid cooling panel in accordance with the principles of the present invention in which two stamped plates 302 and 304 sandwich a channel cover 306 in the form of a plate. This three-plated sandwich embodiment, with plates having channels stamped in them fixed to either side of a channel-free plate that acts as a channel cover for both stamped plates 302 and 304, permits coolant liquid to be delivered to circuit boards situated on either side of the liquid cooling panel.

Figure 4A:
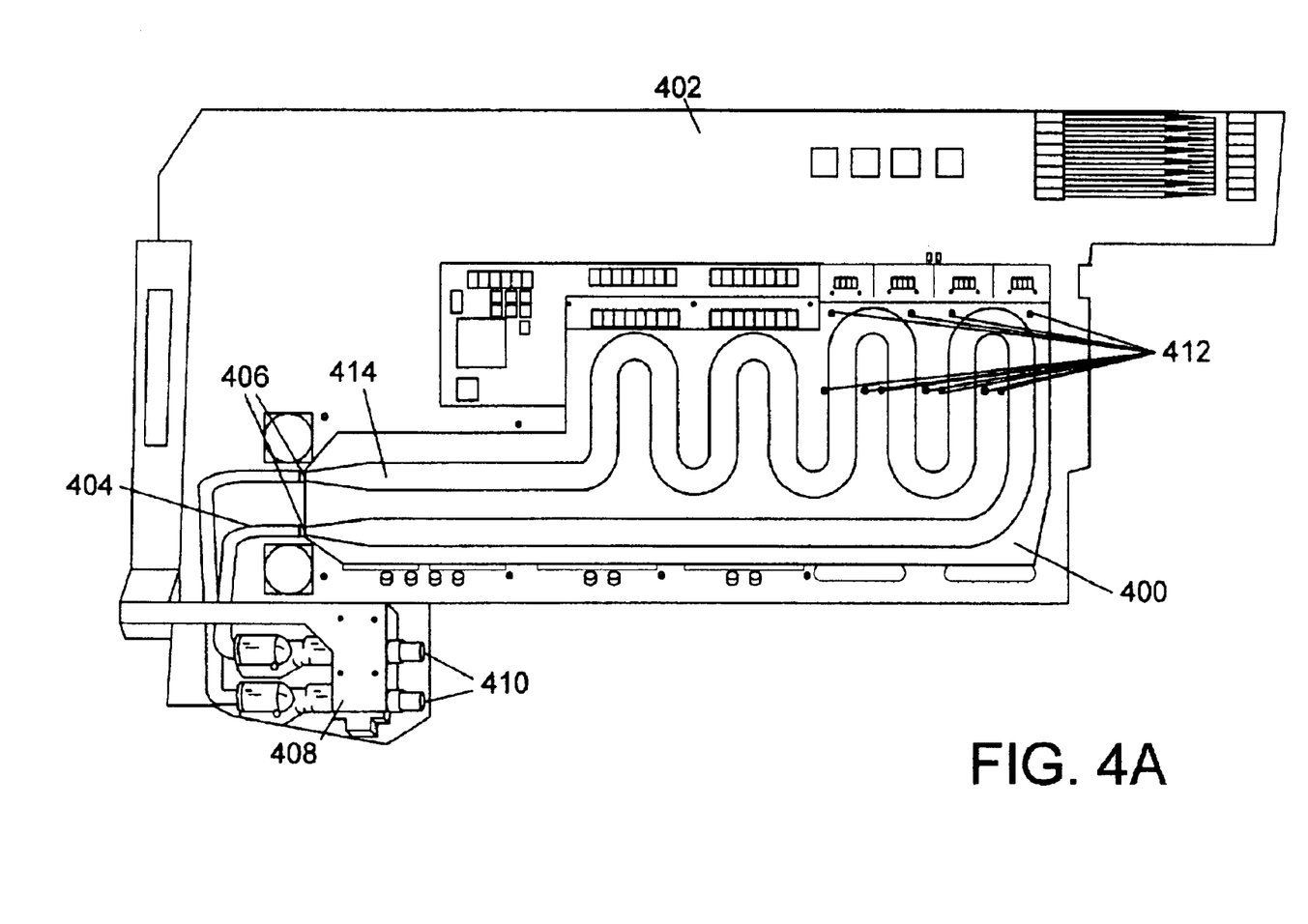
FIGS. 4A–4B are perspective views of a circuit board and liquid cooling panel combination in accordance with the principles of the present invention.

The perspective view of FIG. 4A provides an illustration of a liquid cooling panel 400 in accordance with the principles of the present invention attached to a printed circuit board 402 that includes electronics to be cooled by the liquid cooling panel 400. In this illustrative embodiment, supply tubing 404 is connected to the fixtures 406, such as previously described, at one end, supported by strain-relief structure 408 and connected to liquid connection fixtures 410. In an illustrative embodiment, "dripless micro quick disconnect", model #DC2028, available from Hydraflow, Corp. 13259 East 166th Street, Cerittos, Calif. 90703 (562-

926-9582) are employed as the liquid supply fixtures 410. The liquid cooling panel 400 is attached to the circuit board 402 through attachment points 412. Such attachment may be effected, by means of screws, bolts, studs, or rivets, for example. The channel 414 is supplied liquid coolant from one of the fixtures 406, circulates liquid coolant to underlying electronics and returns coolant that has absorbed thermal energy from the electronics to one of the fixtures 406, after which the coolant may be cooled and recirculated.

Figure 4B:
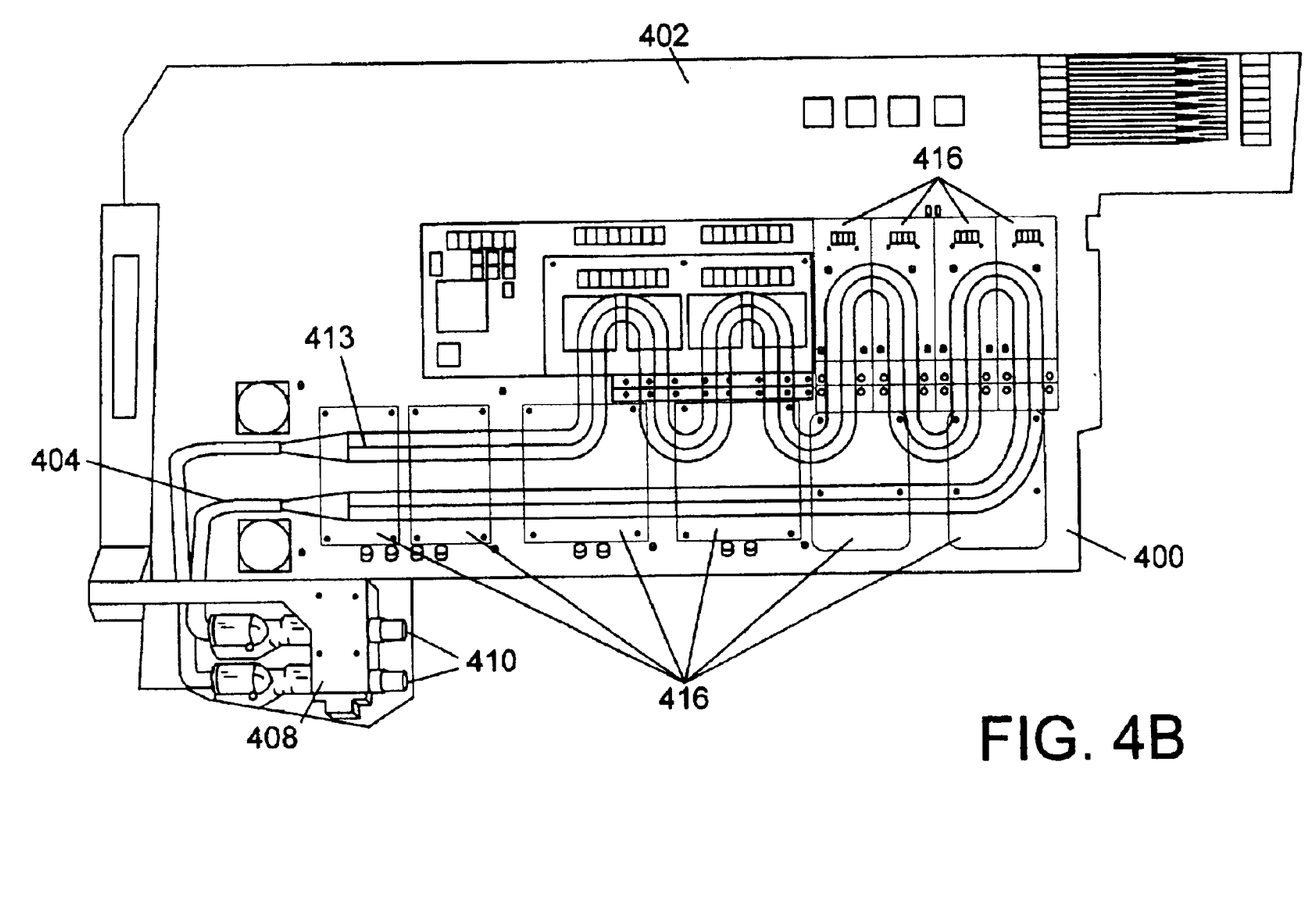

The perspective view of FIG. 4B overlays the outline 413 of the liquid cooling channel 414 on the electronics 416 being cooled. The electronics packages may include heat spreaders having exposed surface areas that are designed for maximum surface contact with the cooling panel 400. The electronics packages of this illustrative embodiment, for example, include heat spreaders having flat surface areas which provide for maximum surface contact with the cooling panel and, thereby, maximum conductive thermal flow from the electronics to the cooling panel 400.

Figure 5:
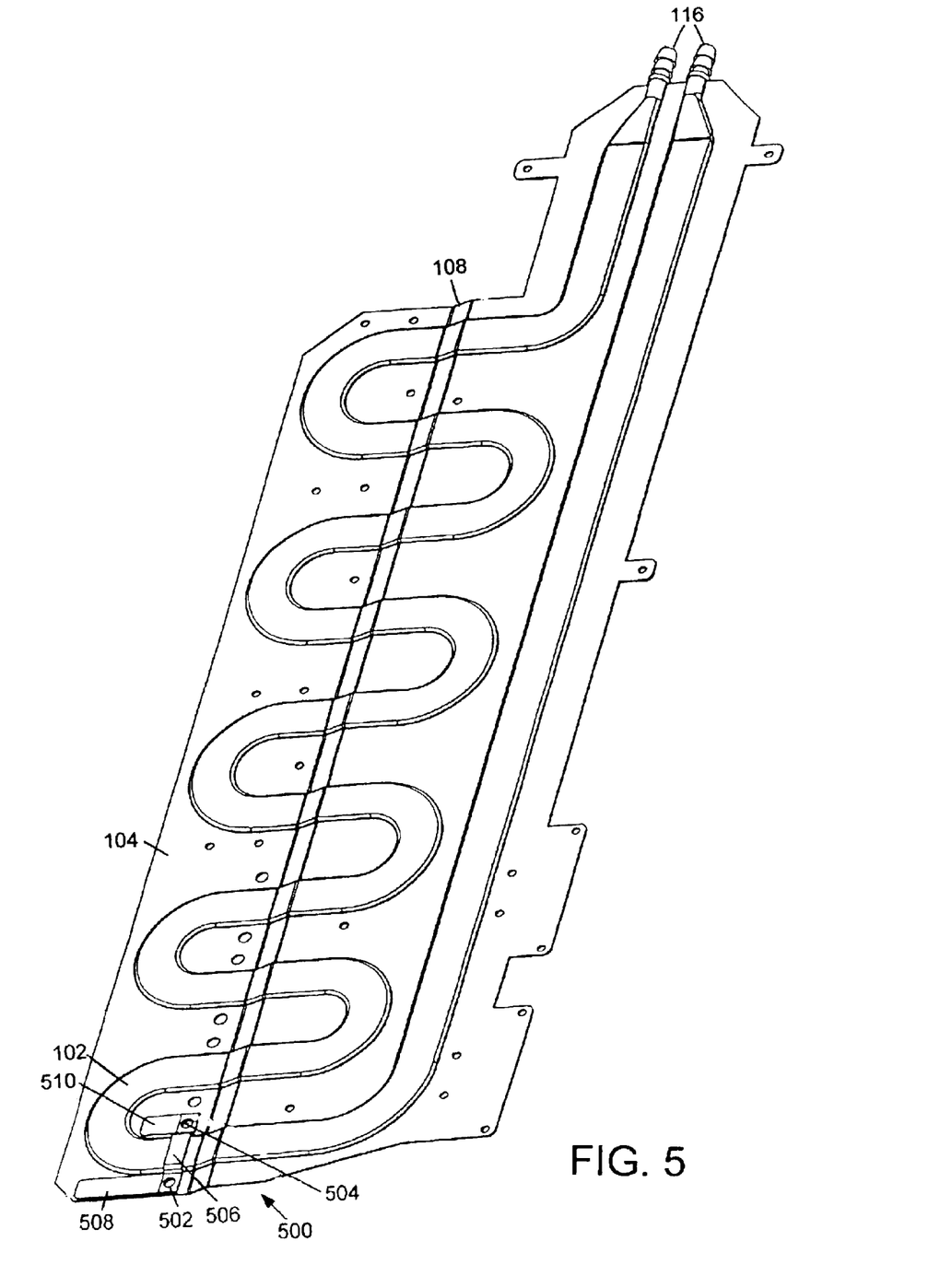
FIG. 5 is a perspective view of a cooling panel in accordance with the principles of the present invention in which a spring clip applies pressure to a portion of the panel to ensure good thermally-conductive contact between the cooling panel and the electronics that are to be cooled by the panel.

The perspective view of FIG. 5 illustrates the use of a spring clip 500 to distribute a compressive force to one or more areas of the cooling panel 100 in order to thereby ensure good thermally conductive contact between the cooling panel 100 and electronics to be cooled by the panel 100/. The spring clip 500 is attached to the panel 100 through conventional attachment means, such as a screw, bolt, stud, or rivet, for example at attachment points 502, 504. In this illustrative embodiment a base 506 supports legs 508, 510 which are pre-stressed to produce a compressive force between the panel 100 and the electronics to be cooled. As will be described in greater detail in the discussion related to FIG. 6, the base 506 may be shaped to conform to the outline of structures, such as the channel 102 that underlie the base 506. In this illustrative embodiment the spring clip 500 provides compressive forces at the extreme of the panel 100 and, in particular, at the extreme end of a bend in the serpentine pattern of the channel 102 thereby ensuring good thermally conductive contact between that section of the channel 102 and the underlying electronics.

Figure 6A:
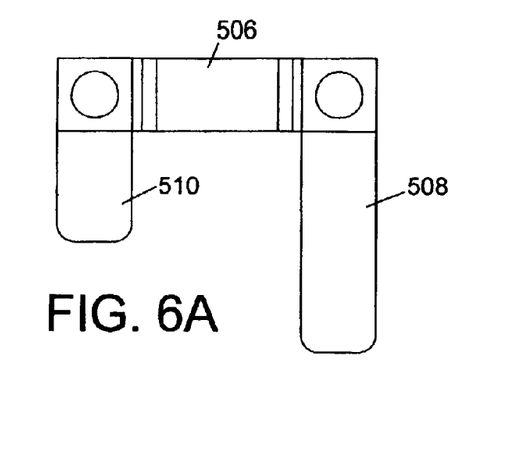
FIGS. 6A through 6C are top plan, portrait, and side views of a spring clip such as may be employed to ensure good thermally-conductive contact between a cooling panel in accordance with the principles of the present invention and electronics that are to be cooled by the panel.
Figure 6B:
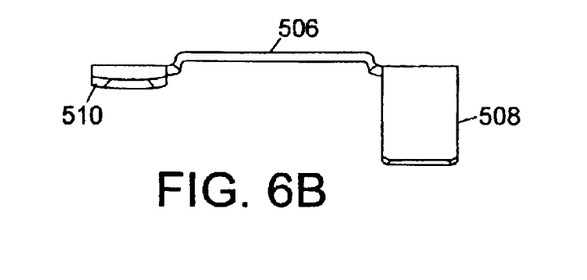
Figure 6C:
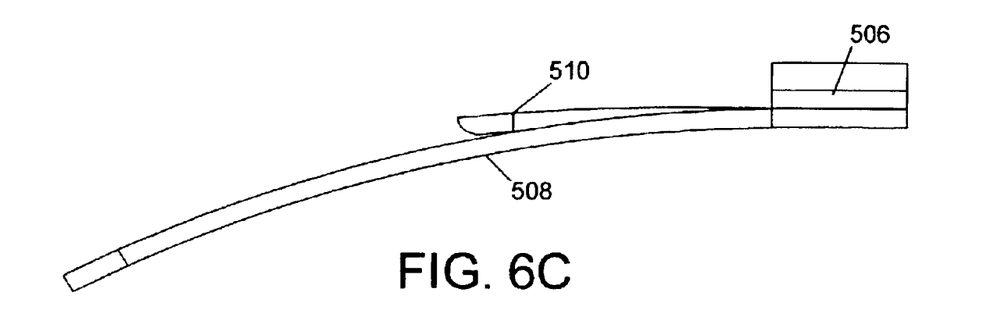

The top plan view of FIG. 6A illustrates a spring clip 500 that may be used in conjunction with a cooling panel in accordance with the principles of the present invention. A base 506 supports legs 508, 510. Although the legs 508, 510 are of unequal length in this illustrative embodiment, in order to accommodate the topography of the channel as illustrated in FIG. 5, they need not be. Many configurations, including equal-length leg, or one or more legs, for example, that enhances thermal contact between the cooling panel 100 and the electronics to be cooled, without significantly adding to the cost or overall thickness of the cooling panel, would be advantageous. The portrait and landscape views of FIGS. 6B and 6C illustrate resting shape and pre-stressed nature of the spring clip. Although the spring clip need not be composed of spring steel, for example, the material should be one that tends to maintain its shape and thereby provides a reactive force when distorted from its resting shape. A plurality of spring clips, such as spring clip 500, may be distributed across the surface of the cooling panel 100 to thereby ensure good thermally conductive contact between the cooling panel 100 and the electronics to be cooled by the thermal panel 100. One or more spring clips 500 may be attached to the circuit board, through the attachment points 502, 504 for example, to apply focused pressure to the cooling panel 100 and thereby insures intimate contact between the cooling panel and electronics being cooled.

Although various exemplary embodiments of the invention have been disclosed, it will be apparent to those skilled in the art that various changes and modifications can be made which will achieve some of the advantages of the invention without departing from the spirit and scope of the invention. It will be apparent to those reasonably skilled in the art that other components performing the same functions may be suitably substituted. The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A substantially planar electronics circuit board cooling panel, comprising:

a circuit board;

at least one thermally conductive plate stamped to form at least one channel for the transport of cooling liquid, the channel being defined by a convex structure stamped into the plate;

a channel covering attached to the stamped plate in a liquid-tight manner to thereby form an enclosed channel for the circulation of cooling liquid; and input and output fixtures respectively formed at input and output ends of each channel to respectively accept and drain cooling liquid, wherein the thermally conductive plate and the channel covering are affixed to the circuit board;

wherein the cross-section of a stamping pattern is an arc with a relatively large radius, so that, in combination with a flat channel covering, the cross-section has the shape of an oblate "D".

2. The cooling panel of claim 1, wherein a second thermally conductive plate is attached in a liquid-tight manner to said thermally conductive plate into which a channel has been stamped, said second thermally conductive plate forming said channel covering.

3. The cooling panel of claim 1, wherein said at least one thermally conductive plate comprises a second thermally conductive plate, wherein said two thermally conductive plates sandwich said channel covering, with each of the two thermally conductive plates including at least one stamped channel pattern and each of the two thermally conductive plates being attached to the channel covering in a liquid-tight manner.

4. The cooling panel of claim 3, wherein a third thermally conductive plate is the channel covering.

5. The cooling panel of claim 1, wherein the cooling panel has a channel layout, wherein said channel layout overlaps predetermined areas on the circuit board being cooled.

6. The cooling panel of claim 1, wherein the cooling panel has a channel layout, wherein the channel layout includes a serpentine section and a straight section.

7. A substantially planar electronics circuit board cooling panel, comprising:

a circuit board;

at least one thermally conductive plate stamped to form at least one channel for the transport of cooling liquid, the channel being defined by a convex structure stamped into the plate;

a channel covering attached to the stamped plate in a liquid-tight manner to thereby form an enclosed channel for the circulation of cooling liquid; and input and output fixtures respectively formed at input and output ends of each channel to respectively accept and drain cooling liquid, wherein the thermally conductive plate and the channel covering are affixed to the circuit board, wherein the thermally conductive plate and the channel covering feature multilevel profiles, the levels conforming to the profile of the circuit board being cooled.

8. The cooling panel of claim 7, wherein said channel covering is a thermally conductive plate, wherein both thermally conductive plates are stamped to form channels for the transport of cooling liquid.

9. The cooling panel of claim 8, wherein the stamping patterns of the two plates overlap, thereby creating a deeper channel than a single stamped channel would create.

10. The cooling panel of claim 8, wherein the stamping patterns of the two plates are non-overlapping and each thermally conductive plate operates as the channel covering for the other plate, thereby creating different channel layouts for opposite sides of the cooling panel.

11. The cooling panel of claim 7, wherein the cooling panel has a channel layout, wherein said channel layout overlaps predetermined areas on the circuit board being cooled.

12. The cooling panel of claim 7, wherein the cooling panel has a channel layout, wherein the channel layout includes a serpentine section and a straight section.

13. A method of cooling one or more substantially planar electronics circuit boards, comprising the steps of:
    (A) stamping a channel pattern in a thermally conductive plate, the channel pattern encompassing a pattern of electronics to be cooled on the circuit board;
    (B) attaching a channel covering to the stamped plate in a liquid-tight manner to thereby form an enclosed channel for the circulation of cooling liquid;
    (C) affixing said thermally conductive plate and said channel covering to a circuit board; and
    (D) pumping a cooling liquid into and out of the channel through input and output fixtures respectively formed at input and output ends of said channel;
    wherein the step (A) of stamping a channel pattern comprises the step of:
    stamping a channel pattern having the cross-section of an arc with a relatively large radius, so that, in combination with a flat channel covering, the channel cross-section has the shape of an oblate "D".

14. The method of claim 13, wherein said channel covering is a second thermally conductive plate.

15. The method of claim 13, wherein the step (A) of stamping a channel pattern comprises the step of:
    laying out the stamped channel pattern to overlap predetermined areas on a circuit board to be cooled.

16. A method of cooling one or more substantially planar electronics circuit boards, comprising the steps of:
    (A) stamping a channel pattern in a thermally conductive plate, the channel pattern encompassing a pattern of electronics to be cooled on the circuit board;
    (B) attaching a channel covering to the stamped plate in a liquid-tight manner to thereby form an enclosed channel for the circulation of cooling liquid;
    (C) affixing said thermally conductive plate and said channel covering to a circuit board; and
    (D) pumping a cooling liquid into and out of the channel through input and output fixtures respectively formed at input and output ends of said channel;
    wherein said thermally conductive plate is substantially flat, wherein the step (A) of stamping a channel pattern comprises the step of:
    stamping said substantially flat thermally conductive plate into multi-level plate that conforms to the profile of integrate circuits located on the circuit board to be cooled.

17. The method of claim 16, wherein said channel covering is a second thermally conductive plate, wherein step (A) comprises the step of:
    (A1) stamping both thermally conductive plates to form channels for the transport of cooling liquid.

18. The method of claim 17, wherein step (A1) comprises the step of:
    (A2) overlapping the stamping patterns of the two plates, thereby creating a deeper channel than a single stamped channel would create.

19. The method of claim 17, wherein step (A1) comprises the step of:
    (A3) stamping non-overlapping patterns in the two plates and employing each thermally conductive plate as the channel covering for the other plate.

20. The method of claim 16, wherein step (A) comprises:
    stamping channel patterns in two thermally conductive plates, the channel pattern encompassing a pattern of electronics to be cooled on the circuit board;
    wherein step (B) comprises the step of:
    (B1) sandwiching said channel covering between said two thermally conductive plates, each plate including at least one stamped channel pattern, each of the two thermally conductive plates being attached to the channel covering in a liquid-tight manner.

21. The method of claim 20, wherein a thermally conductive plate is employed as the sandwiched channel covering of step (B1).

22. The method of claim 16, wherein the step (A) of stamping a channel pattern comprises the step of:
    stamping serpentine and straight sections of a channel pattern into said thermally conductive plate.

23. A method of cooling one or more substantially planar electronics circuit boards, comprising the steps of:
    (A) stamping a channel pattern in a thermally conductive plate, the channel pattern encompassing a pattern of electronics to be cooled on the circuit board;
    (B) attaching a channel covering to the stamped plate in a liquid-tight manner to thereby form an enclosed channel for the circulation of cooling liquid;
    (C) affixing said thermally conductive plate and said channel covering to a circuit board; and
    (D) pumping a cooling liquid into and out of the channel through input and output fixtures respectively formed at input and output ends of said channel;
    wherein said channel covering is a second thermally conductive plate having substantially the same overall dimensions as the thermally conductive plate having a channel pattern stamped into it, wherein the step (B) comprises:
    soldering said second thermally conductive plate to said thermally conductive plate having a channel pattern stamped into it.

* * * * *